(12) United States Patent
Pan

(10) Patent No.: US 11,877,495 B2
(45) Date of Patent: Jan. 16, 2024

(54) DISPLAY PANEL, MANUFACTURING METHOD OF DISPLAY PANEL, AND DISPLAY DEVICE

(71) Applicant: Wuhan China Star Optoelectronics Semiconductor Display Technology Co., Ltd., Hubei (CN)

(72) Inventor: Jie Pan, Hubei (CN)

(73) Assignee: Wuhan China Star Optoelectronics Semiconductor Display Technology Co., Ltd., Wuhan (CN)

(*) Notice: Subject to any disclaimer, the term of this patent is extended or adjusted under 35 U.S.C. 154(b) by 542 days.

(21) Appl. No.: 17/261,609

(22) PCT Filed: Jul. 29, 2020

(86) PCT No.: PCT/CN2020/105400
§ 371 (c)(1),
(2) Date: Jan. 20, 2021

(87) PCT Pub. No.: WO2022/007049
PCT Pub. Date: Jan. 13, 2022

(65) Prior Publication Data
US 2022/0190062 A1 Jun. 16, 2022

(30) Foreign Application Priority Data
Jul. 10, 2020 (CN) .......................... 202010661236.5

(51) Int. Cl.
*H01L 29/08* (2006.01)
*H10K 59/65* (2023.01)
(Continued)

(52) U.S. Cl.
CPC .......... *H10K 59/65* (2023.02); *H10K 59/122* (2023.02); *H10K 71/00* (2023.02); *H10K 59/1201* (2023.02)

(58) Field of Classification Search
CPC ...... H10K 59/65; H10K 59/122; H10K 71/00; H10K 59/1201; H10K 59/12;
(Continued)

(56) References Cited

U.S. PATENT DOCUMENTS

2016/0315288 A1 10/2016 Seo et al.
2017/0104964 A1* 4/2017 Graves .................. G02B 5/201

FOREIGN PATENT DOCUMENTS

CN 110114884 8/2019
CN 110379839 10/2019
(Continued)

*Primary Examiner* — Niki H Nguyen

(57) ABSTRACT

A display panel, a manufacturing method of the display panel, and a display device are provided. The display panel includes an under-screen device area and a non-under-screen device area, wherein an area under the under-screen device area includes an area where hardware is installed; the under-screen device area includes a substrate portion, an anode layer, a pixel definition layer, a deformation layer, a cathode layer, and an encapsulation layer; wherein, a volume of the deformation layer expands under a first predetermined condition to enable a thickness of the cathode layer in the under-screen device area less than a thickness of the cathode layer in the non-under-screen device area.

10 Claims, 4 Drawing Sheets

(51) Int. Cl.
*H10K 59/122* (2023.01)
*H10K 71/00* (2023.01)
*H10K 59/12* (2023.01)

(58) Field of Classification Search
CPC .. H10K 59/131; H10K 50/844; H10K 50/841; H10K 71/20; H10K 50/82; H10K 50/8426; H10K 59/00; H10K 59/121; H10K 2102/311; H10K 50/80; H10K 50/813; H10K 50/84; H10K 59/124; H10K 59/18; H10K 59/35; H10K 59/38; H10K 59/40; H10K 2101/10; H10K 2102/103; H10K 2102/3031; H10K 50/11; H10K 50/828; H10K 50/858; H10K 50/86; H10K 59/1213; H10K 59/123; H10K 59/125; H10K 59/126; H10K 59/1315; H10K 59/173; H10K 59/351; H10K 59/353; H10K 59/50; H10K 71/12; H10K 71/13; H10K 71/18; H10K 71/211; H10K 71/233; H10K 71/50; H10K 71/80; H10K 85/1135; H10K 85/114; H10K 85/324; H10K 85/40; H10K 85/621; H10K 85/631; H10K 85/649; H10K 85/654; H10K 85/6565; H10K 85/6572; H10K 85/791

See application file for complete search history.

(56) References Cited

FOREIGN PATENT DOCUMENTS

| | | | |
|---|---|---|---|
| CN | 110890477 | | 3/2020 |
| CN | 111341820 | * | 6/2020 |

* cited by examiner

DISPLAY PANEL, MANUFACTURING METHOD OF DISPLAY PANEL, AND DISPLAY DEVICE

RELATED APPLICATIONS

This application is a National Phase of PCT Patent Application No. PCT/CN2020/105400 having International filing date of Jul. 29, 2020, which claims the benefit of priority of Chinese Patent Application No. 202010661236.5 filed on Jul. 10, 2020. The contents of the above applications are all incorporated by reference as if fully set forth herein in their entirety.

FIELD AND BACKGROUND OF THE INVENTION

The present invention relates to a field of display technology, in particular to a display panel, a manufacturing method of the display panel, and a display device.

Full-screen mobile phones have become one of the most popular technologies nowadays due to their ultra-high screen-to-body ratio and excellent user experience. In the display devices, organic light-emitting diode (OLED) devices are usually used, while OLED devices are widely used in smart terminal products, such as mobile phones and tablet computers. Because appearances of the OLED devices are easy to customize, more and more manufacturers apply them to full-screen and borderless products. Since full-screen and borderless products require a larger light-emitting area, it is necessary to form installation holes in the organic light-emitting display to reserve installation space for the hardware of the terminal device, such as front camera, earpiece, and start key. In the prior art, installation holes are generally formed in a non-display area outside an effective display area. This method limits an area of the effective display area so it cannot be used to manufacture a full-screen display.

Arranging installation holes in a display area of the display panel can reduce border width and increase an effective area of the display area, thereby realizing the manufacture of a full-screen display. In order to meet the requirements of full-screen panel technology compatible with under-screen devices, devices such as cameras need to be placed under the panel. An area of the panel corresponding to these under-screen devices is called the under-screen device area. In addition, the under-screen device area must meet the requirements of display and light transmission at the same time. Therefore, it is necessary to design the under-screen device area as a semi-transparent display area. That is, a common electrode layer of the display panel in this area needs to achieve a certain degree of light transmittance. However, as shown in FIG. 1 and FIG. 2, current full-screen display panel includes a base substrate 102, a pixel electrode layer 103, an organic layer 104, a common electrode layer 105, and an encapsulation layer 106. The full-screen display panel area includes an under-screen device area 15 and a non-under-screen device area 16. In the prior art, a common electrode layer 105 is vapor-deposited on an entire surface of the full-screen display panel, and a thickness of the common electrode layer 105 is uniform everywhere. It cannot be realized that a thickness of the common electrode layer in the under-screen device area 15 less than a thickness of the common electrode layer in the non-under-screen display area 16. Therefore, it cannot meet the light transmission requirements of the under-screen display area.

In the prior art, hardware such as a camera is placed in the under-screen device area, and the under-screen device area cannot meet the requirements of display and light transmission at the same time. Therefore, no effective solution has been proposed for the problem of low screen occupation.

SUMMARY OF THE INVENTION

In view of the problem, embodiments of the present invention provide a display panel, a manufacturing method of the display panel, and a display device, to solve the problem in the prior art that the region of the display panel where hardware is installed in the prior art limits an area of the effective display area and cannot achieve a full-screen design.

For this purpose, embodiments of the present invention provide following technical solutions:

In a first aspect of the present invention, a display panel is provided, which includes: an under-screen device area and a non-under-screen device area, wherein an area under the under-screen device area includes an area where hardware is installed. The under-screen device area includes a substrate portion, an anode layer, a pixel definition layer, a deformation layer, a cathode layer, and an encapsulation layer sequentially disposed on the substrate portion; wherein, a volume of the deformation layer expands under a first predetermined condition to enable a thickness of the cathode layer in the under-screen device area to be less than a thickness of the cathode layer in the non-under-screen device area.

Alternatively, the first predetermined condition includes an illumination condition of a first predetermined wavelength range; the volume of the deformation layer is restored from an expanded state to an original state under a second predetermined condition, wherein the second predetermined condition includes an illumination condition of a second predetermined wavelength range.

Alternatively, an illumination of the first predetermined wavelength range includes ultraviolet light; and an illumination of the second predetermined wavelength range includes green light.

Alternatively, an area of a top surface of the deformation layer is greater than an area of a bottom surface of the deformation layer, and top surfaces of adjacent deformation layers contact after the volume of the deformation layer expands.

Alternatively, material of the deformation layer is an azophenyl polymer.

In a second aspect of the present invention, a method of manufacturing a display panel is provided, including: defining the display panel as an under-screen device area and a non-under-screen device area; wherein the under-screen device area corresponds to an area under which hardware is installed; providing a substrate; forming an anode layer above the substrate; forming an organic layer and a pixel definition layer above the anode layer; and forming a deformation layer above the pixel definition layer in the under-screen device area; wherein when forming a cathode layer, a volume of the deformation layer is expanded by a first predetermined condition to enable a thickness of the cathode layer positioned above the deformation layer less than a thickness of the cathode layer in the non-under-screen device area.

Alternatively, the first predetermined condition includes an illumination condition of a first predetermined wavelength range; a volume of the deformation layer is restored from an expanded state to an original state under a second predetermined condition, wherein the second predetermined condition includes an illumination condition of a second predetermined wavelength range.

Alternatively, an illumination of the first predetermined wavelength range includes ultraviolet light; and an illumination of the second predetermined wavelength range includes green light.

Alternatively, the material of the deformation layer is an azophenyl polymer.

In a third aspect of the present invention, a display device is provided, including any of the display panels of the above-mentioned first aspect.

BRIEF DESCRIPTION OF THE SEVERAL VIEWS OF THE DRAWINGS

The technical solution of embodiments of the present invention has following advantages: Embodiments of the present invention provide a display panel, a manufacturing method of the display panel, and a display device, the display panel includes: an under-screen device area and a non-under-screen device area, wherein an area under the under-screen device area includes an area where hardware is installed; the under-screen device area includes a substrate portion, an anode layer, a pixel definition layer, a deformation layer, a cathode layer, and an encapsulation layer sequentially disposed on the substrate portion; wherein, a volume of the deformation layer expands under a first predetermined condition to enable a thickness of the cathode layer in the under-screen device area to be less than a thickness of the cathode layer in the non-under-screen device area. In the display panel of an embodiment of the present invention, a deformation layer with a changeable shape is added between a pixel definition layer and a cathode layer of the current display panel, so that a continuous film formation of the cathode layer is hindered during a process of manufacturing the cathode layer. Thus, a thickness of the cathode layer in the under-screen device area is less than a thickness of the cathode layer in the non-under-screen device area. In the display panel of the prior art, a common electrode layer is vapor-deposited on an entire surface of the display panel, a thickness of the common electrode layer everywhere is uniform, which cannot meet the light transmission requirements of the under-screen device area. However, in an embodiment of the present invention, an installation hole can be arranged in the display area of the display panel. That is, a hardware structure is installed in the display area, so the border width can be reduced, and an effective area of the display area can be increased. Therefore, the manufacture of a full-screen display can be realized. It solves the problem that the region of the display panel where the hardware is installed in the prior art limits an area of the effective display area and cannot achieve a full-screen design. In addition, it realizes a normal display of the under-screen device area while ensuring the requirement of light transmittance, thereby improving the display effect of the organic light-emitting display panel.

DESCRIPTION OF SPECIFIC EMBODIMENTS OF THE INVENTION

In order to more clearly illustrate specific embodiments of the present invention or technical solutions in the prior art, the following will briefly introduce drawings that need to be used in the specific embodiments of the present application or the description of the prior art. Obviously, the drawings in the following description are some embodiments of the present invention. For a person of ordinary skill in the art, other drawings can be obtained based on these drawings without paying creative effort.

Figure 1:
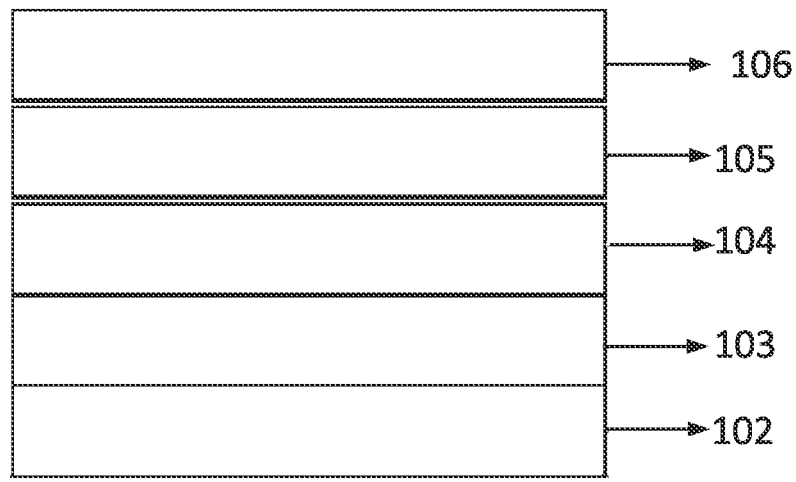

FIG. 1 is a schematic diagram of a cross-sectional structure of a display panel.

Figure 2:
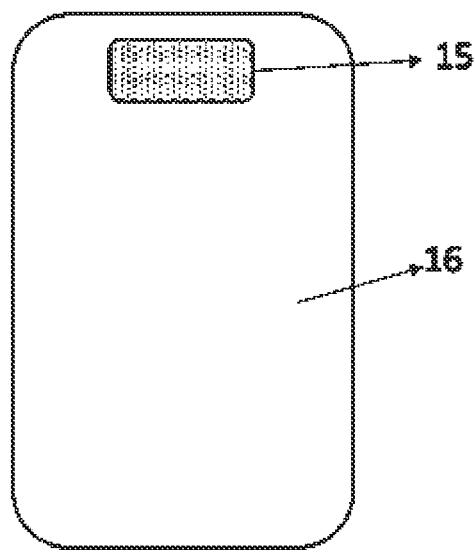

FIG. 2 is a schematic diagram of a structure of the display device.

Figure 3:
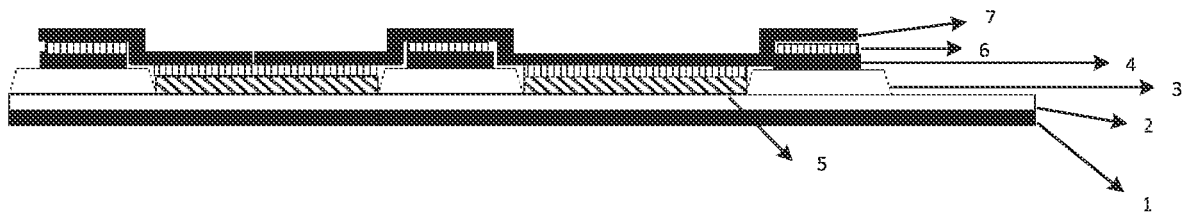

FIG. 3 is a schematic diagram of a cross-sectional structure of a display panel provided according to an embodiment of the present invention.

Figure 4:
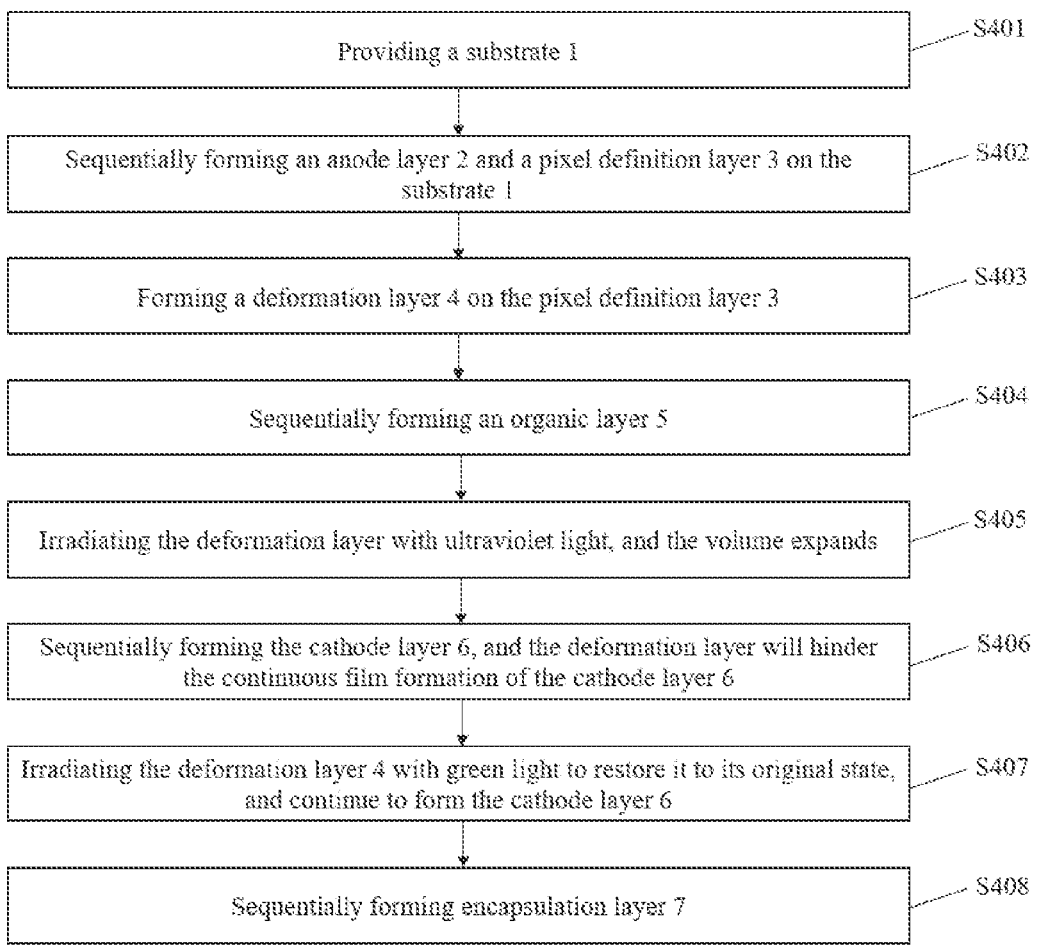

FIG. 4 is a flowchart of a manufacturing method of a display panel according to an embodiment of the present invention.

Figure 5:
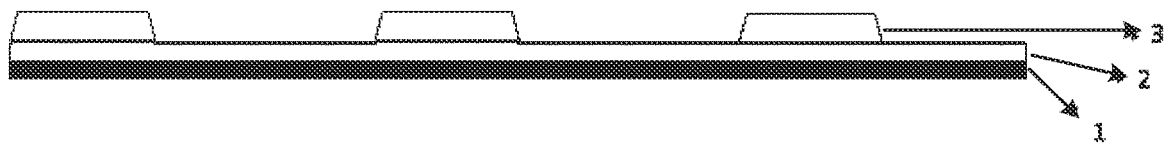

FIG. 5 is a schematic diagram of a cross-sectional structure of a display panel formed during a manufacturing process of the display panel according to an embodiment of the present invention.

Figure 6:
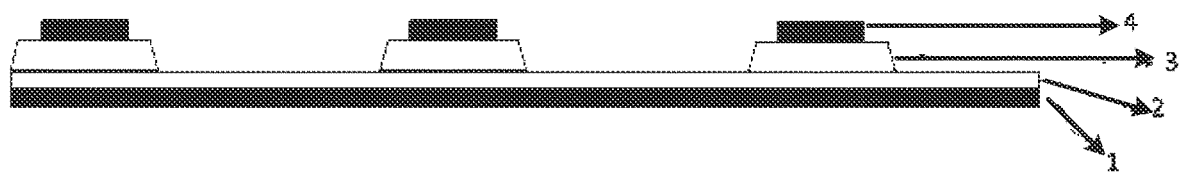

FIG. 6 is a schematic diagram of a cross-sectional structure of a display panel formed during a manufacturing process of the display panel according to an embodiment of the present invention.

Figure 7:
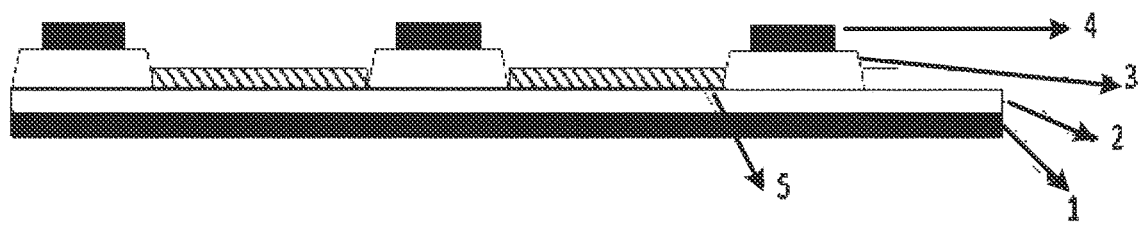

FIG. 7 is a schematic diagram of a cross-sectional structure of a display panel formed in a manufacturing process of the display panel according to an embodiment of the present invention.

Figure 8:
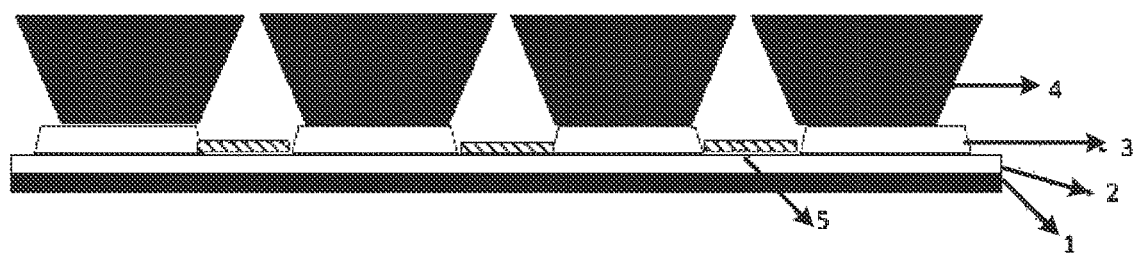

FIG. 8 is a schematic diagram of a cross-sectional structure of a display panel formed during a manufacturing process of the display panel provided by an embodiment of the present invention.

Figure 9:
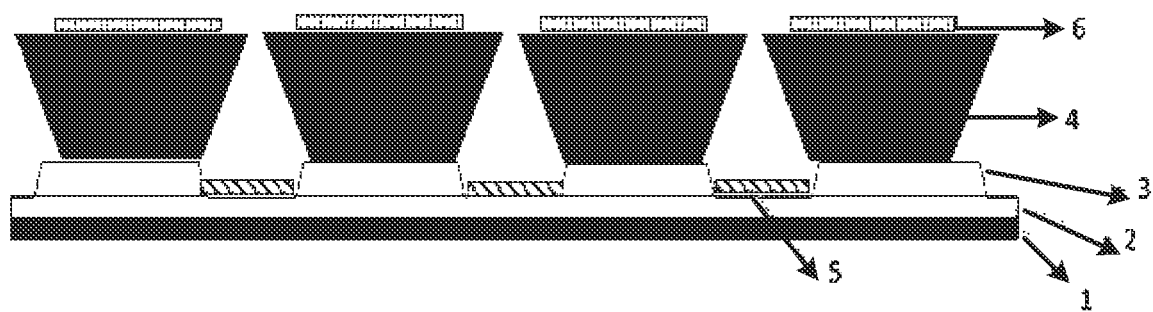

FIG. 9 is a schematic cross-sectional structure diagram of a display panel formed during a manufacturing process of the display panel provided by an embodiment of the present invention.

DETAILED DESCRIPTION OF PREFERRED EMBODIMENTS

The technical solutions in the embodiments of the present application will be described clearly and completely with reference to the drawings in the embodiments of the present application. Obviously, the embodiments are only a part of the embodiments of the present application, rather than all the embodiments. Based on these embodiments in the application, all other embodiments obtained by those skilled in the art without paying creative effort are within the protection scope of the application.

In the description of the application, it should be understood that the orientation or positional relationship indicated by terms "center", "vertical", "lateral", "length", "width", "thickness", "above", "below", "front", "back", "left", "right", "upright" "horizontal", "top", "bottom", "inner", "outer", etc. are based on the orientation or positional relationship shown in the drawings, and are only to facilitate the description of the application and simplify the description, rather than indicating or implying that the device or element must have a specific orientation, be constructed and operated in a specific orientation, and therefore cannot be understood as a limitation of the application. In addition, the terms "first" and "second" are only used for descriptive purposes, and cannot be understood as indicating or implying relative importance or implicitly indicating the number of indicated technical features. Thus, the features defined with "first" and "second" may explicitly or implicitly include one or more features. In the description of the application, "multiple" means two or more than two, unless otherwise specifically defined.

In the present application, the word "exemplary" is used to mean "serving as an example, citation, or illustration." Any embodiment described as "exemplary" in the present application is not necessarily construed as being more preferred or advantageous over other embodiments. In order to enable any person skilled in the art to implement and use the application, following description is given. In the following description, the details are listed for the purpose of explanation. It should be understood that those of ordinary skill in the art can realize that the present application can also be implemented without using these specific details. In other instances, well-known structures and processes will not be described in detail, so as to avoid unnecessary details from obscuring the description of the application. Therefore, the present application is not limited to the illustrated embodiments but is consistent with the widest scope that conforms to the principles and features disclosed in the present application.

The thickness of film layer and the shape of area in the drawings do not reflect a true ratio, and the purpose is only to illustrate the content of the present invention.

According to an embodiment of the present invention, a display panel is provided, in particular to for a full-screen and borderless display panel. Certainly, it can also be applied to ordinary display panels with borders or narrow borders. As long as it is a display panel structure that requires openings in the display panel, the structure can be adopted. The specific structure of the display panel will be described in detail below.

A display panel of an embodiment of the present invention, as shown in FIG. 3, includes an under-screen device area 15 and a non-under-screen device area 16 as shown in FIG. 2. An area under the under-screen device area includes an area where hardware is installed. The hardware includes one or more of the following: front camera, start button, earpiece, or speaker. The specific installation method of the hardware is not limited herein. In an actual manufacturing process of the display panel, positions where hardware needs to be installed and the sizes and shapes of the installation holes are determined based on types of products manufactured. When cutting the installation hole, the shape of the installation hole to be cut is determined based on the structure of hardware to be installed. For different hardware structures, installation holes of different shapes can be provided. Alternatively, a cross-sectional shape of the installation hole in a direction parallel to the base substrate is selected from one or more of following shapes: circle, oval, rectangle, trapezoid, diamond, or square.

The under-screen device area 15 includes: a substrate portion 1, and an anode layer 2, a pixel definition layer 3, a deformation layer 4, a cathode layer 6, and an encapsulation layer 7 disposed on the substrate portion 1 in sequence. A volume of the deformation layer 4 expands under a first predetermined condition to enable a thickness of the cathode layer in the under-screen device area 15 to be less than a thickness of the cathode layer in the non-under-screen device area 16.

In a specific embodiment, the present invention is mainly applicable to full-screen or borderless display panels. An organic light-emitting diode (OLED) display panels generally includes at least a base substrate, and a thin film transistor structure, an anode layer, a light-emitting layer, a cathode layer, and an encapsulation layer disposed on the base substrate in sequence. In addition, it also includes some other film layers, such as a planarization layer, a passivation layer, etc., which are not limited herein. The thin film transistor layer is laminated on a surface of one side of the base substrate for controlling the light emission of the pixel area. Specifically, the thin film transistor layer includes a plurality of thin film transistors. Each thin film transistor includes a gate electrode formed on a base substrate, a gate insulating layer covering the gate electrode, an active layer formed on the gate insulating layer, and a source electrode and a drain electrode formed on the active layer. It can be understood that the above-mentioned thin film transistor is described by taking a bottom gate type thin film transistor as an example, and the present invention is not limited herein. In other embodiments, the thin film transistor can be a top gate type.

In the display panel of an embodiment of the present invention, a deformation layer with a changeable shape is added between a pixel definition layer and a cathode layer of the current display panel, so that a continuous film formation of the cathode layer is hindered during a process of manufacturing the cathode layer. Thus, a thickness of the cathode layer in the under-screen device area 15 is less than a thickness of the cathode layer in the non-under-screen device area 16. In the display panel of the prior art, a common electrode layer is vapor-deposited on an entire surface of the display panel, and a thickness of the common electrode layer everywhere is uniform, which cannot meet the light transmission requirements of the under-screen device area. However, in an embodiment of the present invention, an installation hole can be arranged in the display area of the display panel. That is, a hardware structure can be installed in the display area, so the border width can be reduced, and an effective area of the display area can be increased. Therefore, the manufacture of a full-screen display can be realized. It solves the problem that the region of the display panel where the hardware is installed in the prior art limits an area of the effective display area and cannot achieve a full-screen design. In addition, it realizes a normal display of the under-screen device area while ensuring the requirement of light transmittance, thereby improving the display effect of the organic light-emitting display panel.

In an alternative embodiment, the material of the cathode layer 6 can be a low-power function metal material such as silver (Ag), aluminum (Al), calcium (Ca), indium (In), lithium (Li), magnesium (Mg), or a low-power function composite metal material. The material of the cathode layer in the embodiment can be magnesium silver alloy or metallic magnesium. The power function of magnesium-silver alloy and metallic magnesium is low, which facilitates the transition of electrons generated by a cathode to light-emitting layer, thereby increasing the recombination rate of electrons and holes, and improving luminous efficiency. In addition, the conductivity of them is good, the price is cheap, and so it is helpful to save costs.

In a specific embodiment, the structure of the above-mentioned encapsulation layer is not limited herein. For example, it can be a three-layered structure including a first inorganic layer, a second organic layer, and a third inorganic layer. Certainly, it can also be a multilayer laminated structure. In which, an inorganic layer of the encapsulation layer can include silicon nitride, silicon oxynitride, silicon oxide, or aluminum oxide; and an organic layer of the encapsulation layer can include organic compound materials such as acrylic, epoxy, and silicon. The encapsulation layer is disposed on one side of the cathode layer away from the array substrate. It is easy to understand that because organic light-emitting materials are very sensitive to external environments such as water vapor and oxygen if the organic light-emitting material layer in the display panel is exposed to water vapor or oxygen, the performance of the display panel will drop sharply or be completely damaged. The encapsulation layer can block air and water vapor for the organic light-emitting unit, thereby ensuring the reliability of the display panel.

It can be understood that the substrate in this embodiment can be a flexible substrate, and the corresponding organic light-emitting display panel can be a flexible organic light-emitting display panel. The flexible organic light-emitting display panel has special effects such as low power consumption and flexibility, and is suitable for various display devices, especially for wearable display devices. Alternatively, the material of the flexible substrate is polyester imide or polyethylene terephthalate resin. In addition, the substrate can also be a rigid substrate, and the corresponding organic light-emitting display panel is a rigid organic light-emitting display panel. In fact, this embodiment does not specifically limit the material of the organic light-emitting display panel.

The material of the anode in this embodiment can be a transparent conductive film, such as indium tin oxide or indium zinc oxide. Specifically, the anode includes at least a reflective film, the reflective film can be positioned on a surface of the anode close to the light-emitting layer, and the material of the reflective film can be silver. Moreover, a negative voltage can be applied to the cathode during the electroluminescence process.

The organic light-emitting display panel in this embodiment may have m light emitting colors, and m is an integer greater than or equal to 3. The exemplary embodiment includes three light-emitting colors, namely red, green, and blue, and each organic light-emitting device corresponds to one light-emitting color. The organic functional layer included in the organic light-emitting device includes an electron transport layer, a hole transport layer, and a light-emitting layer. The electron transport layer is positioned close to the cathode, the hole transport layer is positioned close to the anode, and the light-emitting layer is positioned between the electron transport layer and the hole transport layer. Under the action of an external electric field, electrons e are injected from cathode to the organic functional layer, and holes h are injected from anode to the organic functional layer. The injected electron e migrates from the electron transport layer of the organic functional layer to the light-emitting layer, and the injected holes h migrate from the hole transport layer of the organic functional layer to the light-emitting layer. The injected electrons e and the injected holes h generate excitons after recombination in the light-emitting layer. The excitons migrate under the action of an electric field and transfer energy to the organic light-emitting molecules in the light-emitting layer. The electrons of organic light-emitting molecules transition from the ground state to the excited state and release energy, and finally the energy is released in a form of photons and thus emits light.

The organic light-emitting device includes at least an organic light-emitting device whose emission color is red, an organic light-emitting device whose emission color is green, and an organic light-emitting device whose emission color is blue. The pixel definition layer 3 is used to classify an organic light-emitting device whose light-emitting color is red, an organic light-emitting device whose light-emitting color is green, and an organic light-emitting device whose light-emitting color is blue. Exemplarily taking an organic light-emitting device whose emission color is red as an example, for the organic light emitting device, the larger the shielding area of the pixel defining layer 3 is, the smaller the outlet for emitting red light is. On the contrary, for the organic light-emitting device, the smaller the shielding area of the pixel defining layer, the outlet for emitting red light is larger and the light emission is more. In fact, the light-emitting area of each organic light-emitting device is not particularly limited in this embodiment, and the specific value depends on individual products.

The above-mentioned first predetermined condition that can change a volume of the deformation layer 4 includes various types. For example, the deformation layer 4 may change from a trans-structure to a cis-structure and undergo volume expansion under light irradiation of a specific wavelength range. It can also change from a cis-structure to a trans-structure under light irradiation of a specific wavelength range. The first predetermined condition may be an illumination condition of a first predetermined wavelength range. When the light of the first predetermined wavelength range irradiates the deformation layer 4, a volume of the deformation layer 4 becomes larger. The volume of the deformation layer 4 returns to its original state from an expanded state under the second predetermined condition. The second predetermined condition may be, for example, an illumination condition of a second predetermined wavelength range. Specifically, the light of the first predetermined wavelength range can be a light source with a shorter wavelength such as ultraviolet light, and the light of the second predetermined wavelength range can be a light source with a longer wavelength such as green light.

In an alternative embodiment, an area of a top surface of the deformation layer is greater than an area of a bottom surface, and after a volume of the deformation layer expands, top surfaces of adjacent deformation layers contact. Furthermore, the cathode layer 6 above the pixel definition layer 3 in the under-screen device area 15 can be continuously formed into a film. That is, a thickness of the cathode layer in the under-screen device area 15 is uniform, and the uniform thickness is smaller than a thickness of the cathode layer in the non-under-screen device area 16.

In an alternative embodiment, the material of the deformation layer 4 is azophenyl polymer $C_4AzoC_{11}OH$,

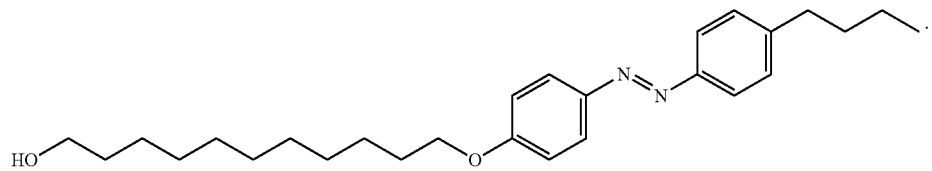 [SMILES: CCCCc1ccc(/N=N/c2ccc(OCCCCCCCCCCCO)cc2)cc1]

An embodiment of the present invention also provides a method of manufacturing a display panel, which divides the display panel into an under-screen device area and a non-under-screen device area; wherein an area below the under-screen device area includes an area for installing hardware. As shown in FIG. 4, the manufacturing method of the display panel includes following process steps:

Step S401: providing a substrate and the substrate in this step is an integral substrate covering the under-screen device area 15 and the non-under-screen device area 16.

Step S402: forming an anode layer 2 and a pixel definition layer 3 above the substrate. FIG. 5 shows a cross-sectional structure of the display panel during a manufacturing process of the display panel.

Step S403: forming a deformation layer on the pixel definition layer in the under-screen device area 15. For example, the deformation layer 4 can be formed by chemical vapor deposition and then be etched, or be formed by evaporation or transfer. FIG. 6 shows a cross-sectional structure of the display panel during the manufacturing process.

The chemical vapor deposition mentioned above refers to a process of introducing gaseous or liquid reactant vapor and other gases required for the reaction into a reaction chamber, and chemical reactions occur on a surface of the substrate to form a film. It has advantages of low deposition temperature, easy control of film composition and thickness, film thickness proportional to deposition time, good uniformity and repeatability, and convenient operation.

Step S404: the organic layer 5 is sequentially formed. FIG. 7 shows a cross-sectional structure of a display panel during a manufacturing process of the display panel.

Step S405: when forming the cathode layer, a volume of the deformation layer is expanded under a first predetermined condition, so as to shield the cathode layer above it. The above-mentioned first predetermined condition that can change a volume of the deformation layer 4 includes various types. For example, the first predetermined condition can be an illumination condition of a first predetermined wavelength range. When the deformation layer 4 is irradiated with light of the first predetermined wavelength range, a volume of the deformation layer 4 expands and becomes larger. The volume of the deformation layer 4 is restored from an expanded state to an original state under a second predetermined condition, and the second predetermined condition can be, for example, an illumination condition of a second predetermined wavelength range. Specifically, the illumination of the first predetermined wavelength range can be a light source with a shorter wavelength such as ultraviolet light, and the illumination of the second predetermined wavelength range can be a light source with a longer wavelength such as green light. FIG. 8 shows a cross-sectional structure of the display panel in the manufacturing process of the display panel. An area of a top surface of the deformation layer is greater than an area of a bottom surface, and after the volume of the deformation layer expands, top surfaces of adjacent deformation layers contact. Furthermore, the cathode layer 6 above the pixel definition layer 3 in the under-screen device area 15 can be continuously formed into a film. That is, a thickness of the cathode layer in the under-screen device area 15 is uniform, and the uniform thickness is less than a thickness of the cathode layer in the non-under-screen device area 16.

It should be noted that the volume of the deformation layer 4 can be expanded at the beginning, middle, or end of the process of forming the cathode layer to make its film thickness thinner.

In an alternative embodiment, the material of the deformation layer 4 is azophenyl polymer $C_4AzoC_{11}OH$, Step S406: forming the cathode layer 6 in sequence, and the deformation layer will hinder the continuous film formation of the cathode layer 6. As shown in FIG. 9, the cross-sectional structure of the display panel in the manufacturing process of the display panel.

Step S407: irradiating the deformable layer 4 with green light to restore it to its original state, and continue to form the cathode layer 6 so that a thickness of the cathode layer above the deformation layer is less than a thickness of the cathode layer in the non-under-screen device area, as shown in FIG. 3.

Step S408: forming the encapsulation layer 7 in sequence.

The substrate in this embodiment can be a flexible substrate, and the corresponding organic light-emitting display panel can be a flexible organic light-emitting display panel. The flexible organic light-emitting display panel has characteristics of low power consumption and bendability and is suitable for various display devices, especially for wearable display devices. Alternatively, the material of the flexible substrate is polyester imide or polyethylene terephthalate resin. In addition, the substrate can also be a rigid substrate, and the corresponding organic light-emitting display panel is a rigid organic light-emitting display panel. In fact, this embodiment does not specifically limit the material of the organic light-emitting display panel.

An embodiment of the present invention also provides a display device, including the display panel of any of the foregoing embodiments. Take a mobile phone as an example of the display devices, but the display devices are not limited to a mobile phone. Specifically, the display devices can include but are not limited to, a personal computer (PC), a personal digital assistant (PDA), a wireless handheld device, a tablet computer, an MP4 player, or a television, or any other electronic device with display function.

As described above, in the display panel of an embodiment of the present invention, a deformation layer with a changeable shape is added between a pixel definition layer and a cathode layer of the current display panel, so that a continuous film formation of the cathode layer is hindered during a process of manufacturing the cathode layer. Thus, a thickness of the cathode layer in the under-screen device area is less than a thickness of the cathode layer in the non-under-screen device area. In the display panel of the prior art, a common electrode layer is vapor-deposited on an entire surface of the display panel, a thickness of the common electrode layer everywhere is uniform, which cannot meet the light transmission requirements of the under-screen device area. However, in an embodiment of the present invention, an installation hole can be arranged in the display area of the display panel. That is, a hardware structure is installed in the display area, so the border width can be reduced, and an effective area of the display area can be increased. Therefore, the manufacture of a full-screen display can be realized. It solves the problem that the region of the display panel where the hardware is installed in the prior art limits an area of the effective display area and cannot achieve a full-screen design. In addition, it realizes a normal display of the under-screen device area while ensur-

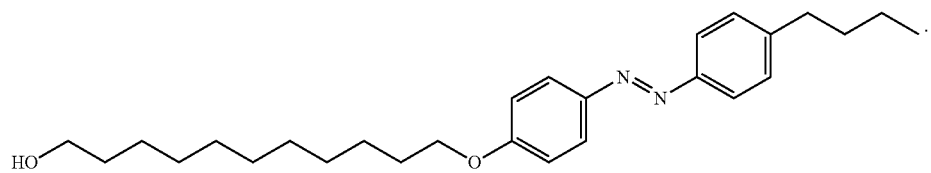 [SMILES: CCCCc1ccc(/N=N/c2ccc(OCCCCCCCCCCCO)cc2)cc1]

ing the requirement of light transmittance, thereby improving the display effect of the organic light-emitting display panel.

In addition, the technical features involved in the embodiments of the present invention described above can be combined with each other as long as they do not conflict with each other.

Although the embodiments of the present invention have been described with reference to accompanying drawings, those skilled in the art can make various modifications and changes without departing from the spirit and scope of the present invention. Such modifications and changes fall within the scope defined by the claims.

What is claimed is:

1. A display panel, comprising:
    an under-screen device area and a non-under-screen device area, wherein an area under the under-screen device area comprises an area where hardware is installed; the under-screen device area comprises a substrate portion, an anode layer, a pixel definition layer, a deformation layer, a cathode layer, and an encapsulation layer sequentially disposed on the substrate portion;
    wherein a volume of the deformation layer expands under a first predetermined condition to enable a thickness of the cathode layer in the under-screen device area to be less than a thickness of the cathode layer in the non-under-screen device area.

2. The display panel according to claim 1, wherein the first predetermined condition comprises an illumination condition of a first predetermined wavelength range; the volume of the deformation layer is restored from an expanded state to an original state under a second predetermined condition, wherein the second predetermined condition comprises an illumination condition of a second predetermined wavelength range.

3. The display panel of claim 2, wherein an illumination of the first predetermined wavelength range comprises ultraviolet light; and an illumination of the second predetermined wavelength range comprises green light.

4. The display panel according to claim 1, wherein an area of a top surface of the deformation layer is greater than an area of a bottom surface of the deformation layer, and top surfaces of adjacent deformation layers contact after the volume of the deformation layer expands.

5. The display panel according to claim 1, wherein material of the deformation layer is an azophenyl polymer.

6. A method of manufacturing a display panel, comprising:
    dividing the display panel into an under-screen device area and a non-under-screen device area; wherein the under-screen device area corresponds to an area under which hardware is installed;
    providing a substrate;
    forming an anode layer above the substrate;
    forming an organic layer and a pixel definition layer above the anode layer; and
    forming a deformation layer above the pixel definition layer in the under-screen device area; wherein when forming a cathode layer, a volume of the deformation layer is expanded by a first predetermined condition to enable a thickness of the cathode layer positioned above the deformation layer less than a thickness of the cathode layer in the non-under-screen device area.

7. The method of manufacturing the display panel according to claim 6, wherein the first predetermined condition comprises an illumination condition of a first predetermined wavelength range; a volume of the deformation layer is restored from an expanded state to an original state under a second predetermined condition, wherein the second predetermined condition comprises an illumination condition of a second predetermined wavelength range.

8. The method of manufacturing the display panel according to claim 7, wherein an illumination of the first predetermined wavelength range comprises ultraviolet light; and an illumination of the second predetermined wavelength range comprises green light.

9. The method of manufacturing the display panel according to claim 6, wherein material of the deformation layer is an azophenyl polymer.

10. A display device, comprising the display panel of claim 1.

* * * * *